(12) United States Patent
Trandafir

(10) Patent No.: US 7,812,504 B1
(45) Date of Patent: Oct. 12, 2010

(54) APPARATUS FOR HIGH EFFICIENCY, HIGH SAFETY ULTRASOUND POWER DELIVERY WITH DIGITAL EFFICIENCY INDICATOR AND ONE CLOCK CYCLE SHUTDOWN

(75) Inventor: Titi Trandafir, South Plainfield, NJ (US)

(73) Assignee: Microtrend Systems Inc., South Plainfield, NJ (US)

( * ) Notice: Subject to any disclaimer, the term of this patent is extended or adjusted under 35 U.S.C. 154(b) by 238 days.

(21) Appl. No.: 12/215,393

(22) Filed: Jun. 27, 2008

(51) Int. Cl.
    *H01L 41/09* (2006.01)
(52) U.S. Cl. ..................................... 310/317
(58) Field of Classification Search ............... 310/314, 310/317, 316.03
    See application file for complete search history.

(56) References Cited

U.S. PATENT DOCUMENTS

| | | |
|---|---|---|
| 3,889,166 A | 6/1975 | Scurlock |
| 3,919,656 A | 11/1975 | Sokal et al. |
| 4,056,761 A | 11/1977 | Jacoby et al. |
| 4,530,138 A | 7/1985 | Ritter |
| 4,791,915 A | 12/1988 | Barsotti et al. |
| 5,003,965 A | 4/1991 | Talish et al. |
| 5,026,387 A | 6/1991 | Thomas |
| 5,186,162 A | 2/1993 | Talish et al. |
| 5,630,420 A | 5/1997 | Vaitekunas |
| 5,705,879 A * | 1/1998 | Abe et al. ............ 310/359 |
| 6,261,249 B1 | 7/2001 | Talish et al. |
| 6,400,096 B1 * | 6/2002 | Wells et al. ............ 315/224 |
| 6,860,852 B2 | 3/2005 | Schonenberger et al. |
| 7,273,483 B2 | 9/2007 | Wiener et al. |

OTHER PUBLICATIONS

T. Suetsugu et al."ZVS Condition Predicting Sensor for Class E Amplifier", IEEE Transactions on Circuits and Systems-1 fund theory and applications, vol. 50,No. 6 , Jun. 2003.
T. Suetsugu et al"Design Procedure of Class-E Amplifier for Off-nominal Operation at 50% Duty Cycle", IEEE Transactions on CAS-regular papers, vol. 53,No. 7,Jul. 2006.

(Continued)

*Primary Examiner*—Thomas M Dougherty
*Assistant Examiner*—Derek J Rosenau

(57) ABSTRACT

The invention in general relates to Medical Instruments for bone fracture healing, ultrasonic surgery, tissue ablation and cutting and drilling, dry powder inhalers and more particularly to a method to monitor load condition and overall efficiency, safety and reliability of ultrasonic energy delivery using a Class E power Amplifier. Three parameters: frequency (f), duty cycle (D) and Power Amplifier supply voltage (Vdd) are continuously adjusted in order to maintain optimal and suboptimal Class E operation. The load for the power driver can be a single element or a stack. For every frequency and duty cycle of operation the MOSFET drain voltage is compared to a known value which is proportional to Power Amplifier supply voltage Vdd. During the MOSFET OFF part of operation a timer is started when drain voltage falls below a known threshold value. The timer is stopped by the MOSFET leading edge gate clock. A measure of the distance from optimal operation is implemented in the form of a counter value N thus allowing a continuous load monitoring. A one Class E Amplifier clock cycle reaction to fast load change is thus possible and therefore a robust efficient operation, with increased safety and reliability of Ultrasonic power delivery.

4 Claims, 7 Drawing Sheets

General circuit diagram

OTHER PUBLICATIONS

T. Suetsugu et al. "Off-Nominal Operation of Class-E Amplifier at any Duty Ratio", IEEE Transactions on Circuits and Systems-1 regular papers, vol. 54,No. 6 ,Jun. 2007.

M. K. Kazimierczuk et al. "Class E DC/DC Converters with an inductive Impedance Inverter", IEEE Transactions on Power Electronics vol. 4,No. 1 , Jan. 1989.

M. K. Kazimierczuk et al. "Class E Amplifier with an inductive Impedance Inverter", IEEE Transactions on Industrial Electronics vol. 37,No. 2 , Apr. 1990.

Juan M. Rivas et al. "Design Consideration for Very High Frequency dc-dc Converters",37th IEEE Power Electronics Specialists Conference Jun. 18-22 , 2006 ,Jeju, Korea.

Frederick H. Raab. " Effects of Circuit Variations on the Class E Tuned Power Amplifier", IEEE Journal of Solid-State Circuits vol. SC-13, No. 2, Apr. 1978.

"Piezoelectric Technology Data for Designers," Morgan Matroc Inc., Electro Ceramics Division.

"Piezoelectric Ceramics Properties & Applications," Morgan Matroc Inc., Electro Ceramics Division.

* cited by examiner

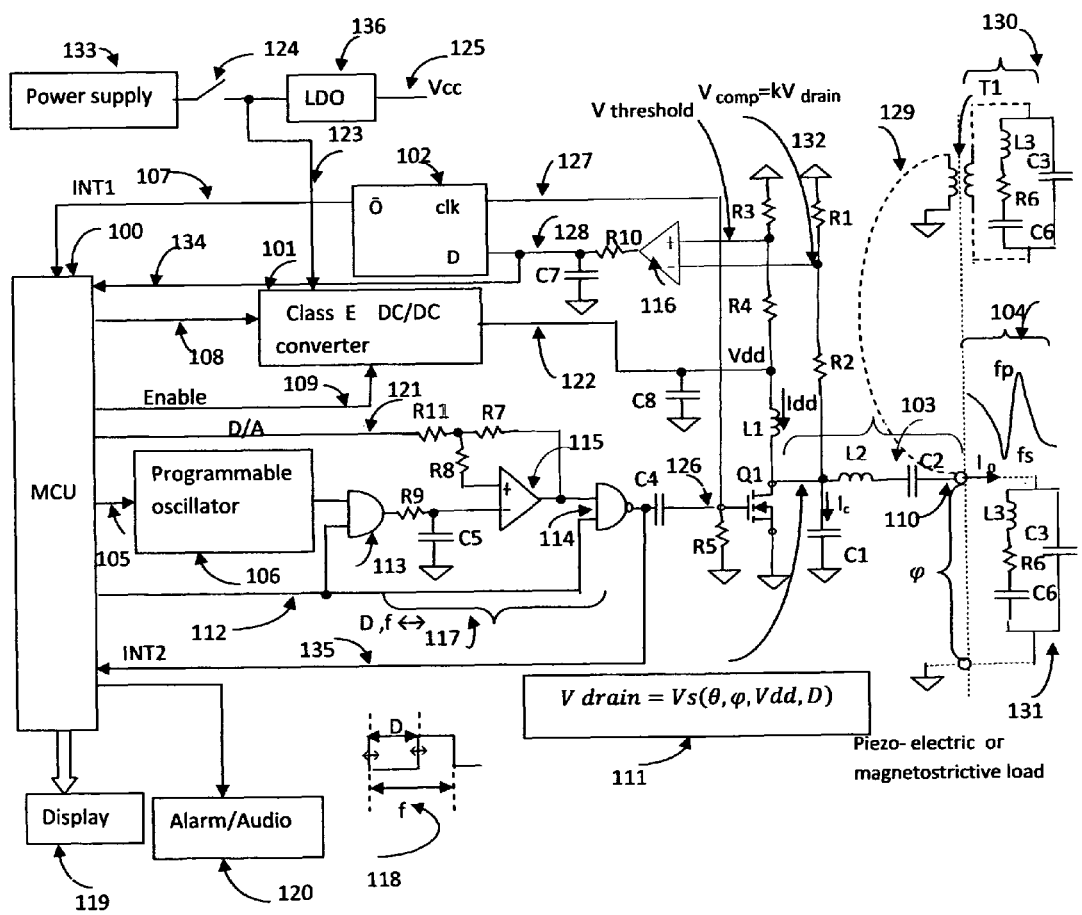
Figure 1  General circuit diagram

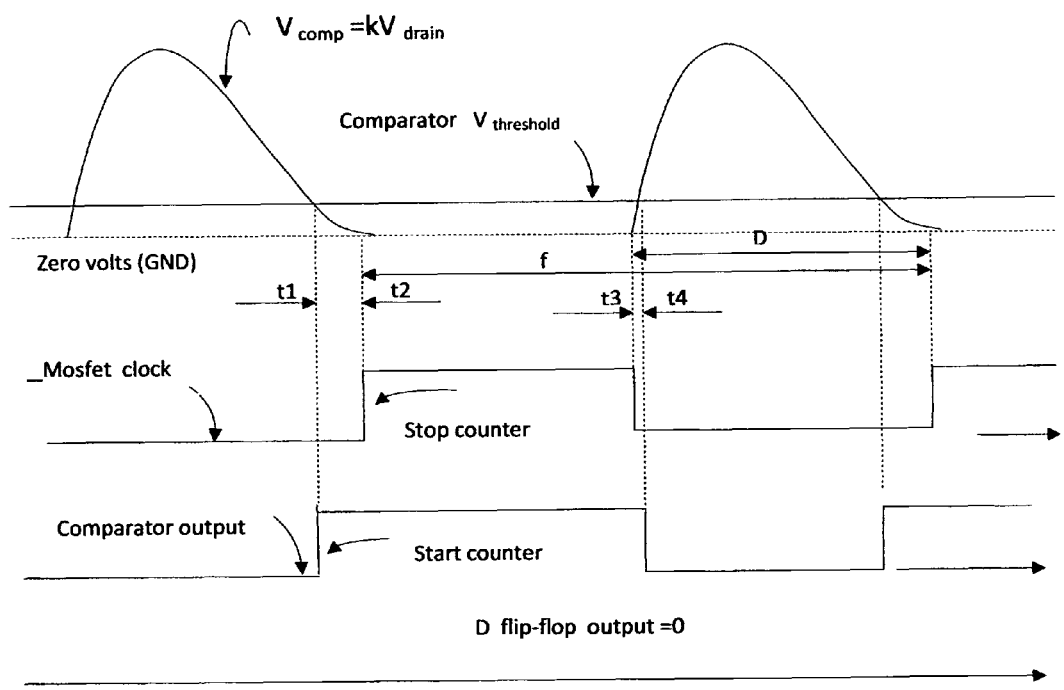
Fig.2 Optimal drain voltage landing

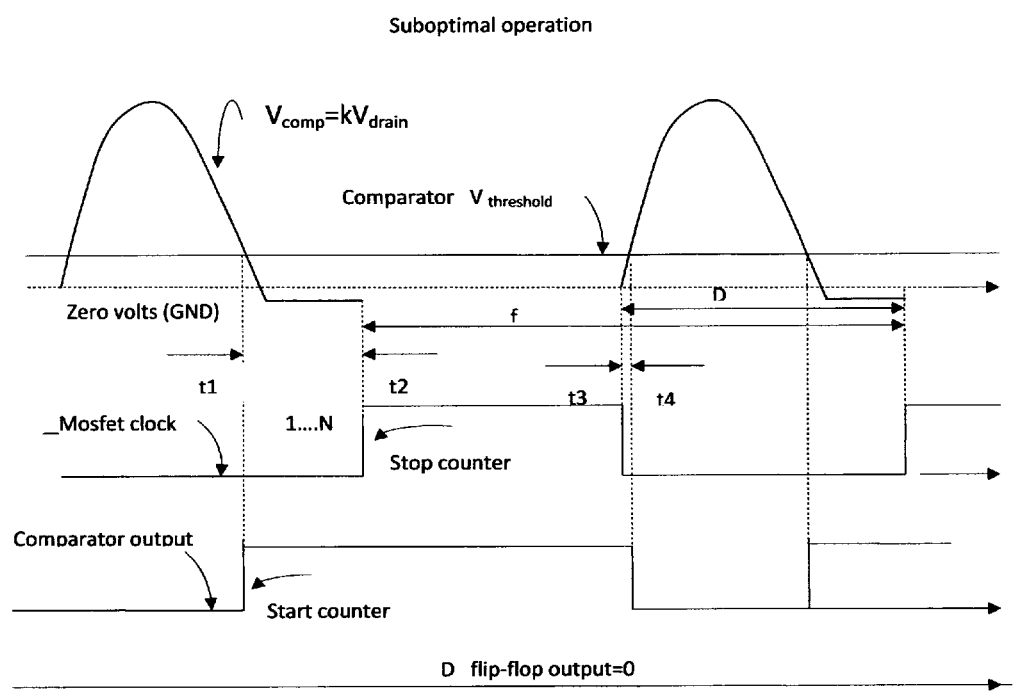
Fig.3 Suboptimal drain voltage landing

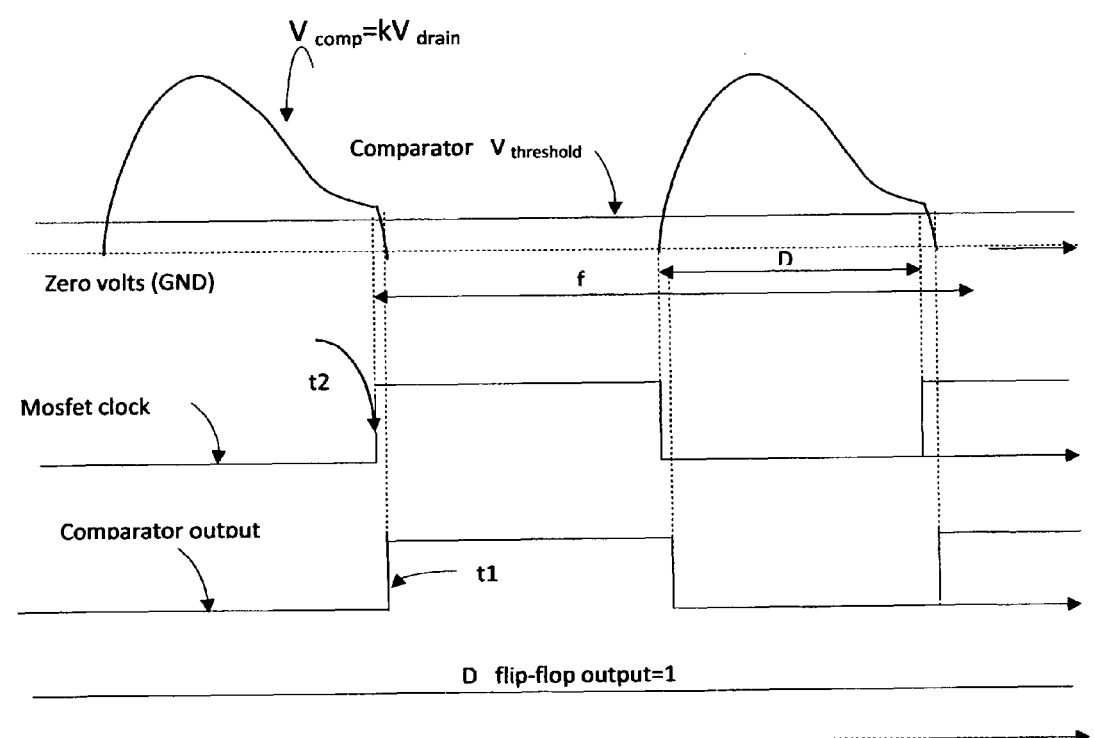
Fig.4 Low Q non-optimal Mosfet drain voltage landing

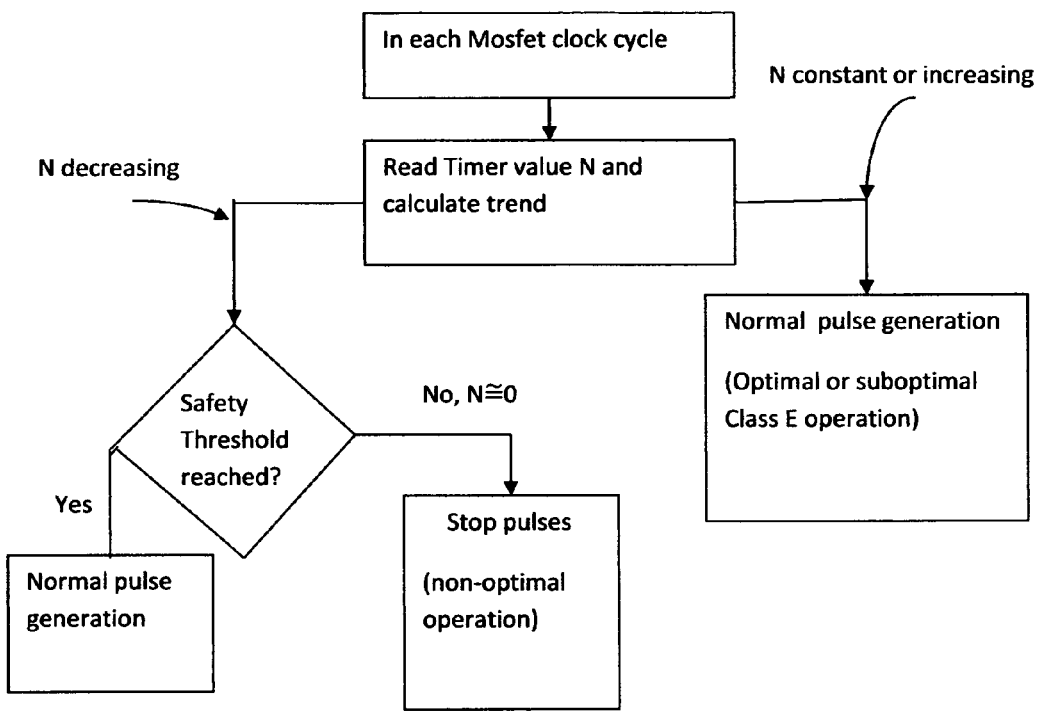
Fig. 5 Software loop for MOSFET clock generation

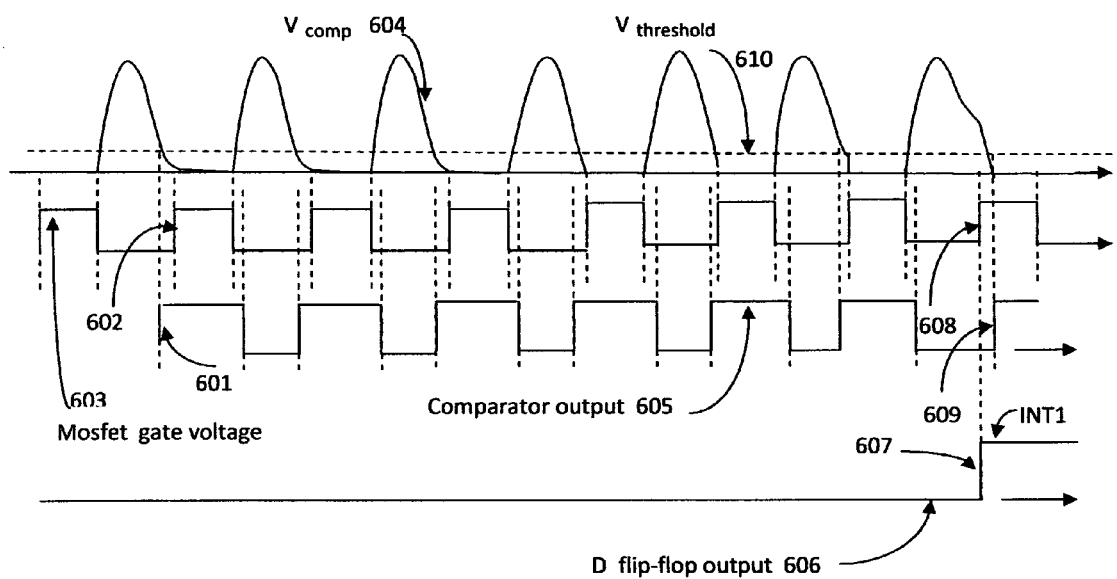
Fig. 6 Transition from optimal operation to non optimal due to increasing load resistance (lower Q)

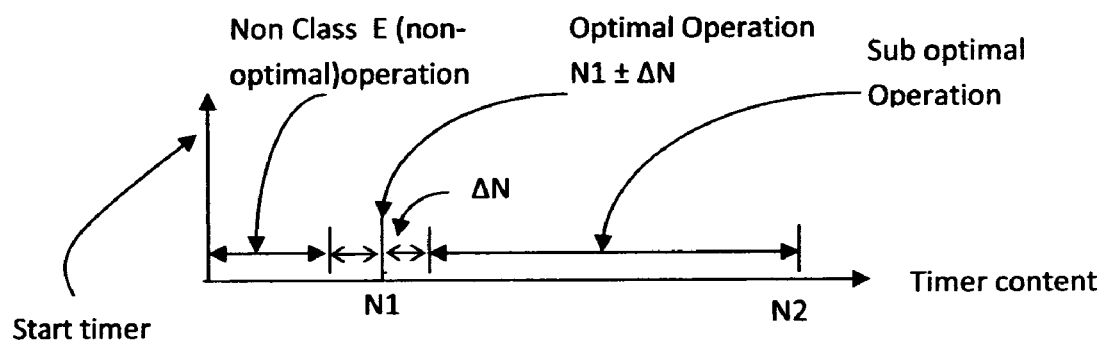
Fig. 7 Illustration of timer content for different operating conditions

APPARATUS FOR HIGH EFFICIENCY, HIGH SAFETY ULTRASOUND POWER DELIVERY WITH DIGITAL EFFICIENCY INDICATOR AND ONE CLOCK CYCLE SHUTDOWN

BACKGROUND OF THE INVENTION

In Medical Instrumentation applications using ultrasonic energy as means to perform work, many solutions have been presented for different constitutive building blocks like current/voltage feedback loops, driver Amplifier (single stage, push-pull, half bridge, full bridge). In bone fracture healing and various surgical Instruments a wide load variation is expected and for safety and reliability reasons a fast response to fast load change is desired. These Instruments use piezoelectric single elements or stacks as load for the power amplifier. For low acoustic power application, in general less than 5 Watts a single element is used, for higher power, for example higher than 20 Watts a stack of elements is preferred. The electrical parameters [8], [9] are well defined by the manufacturer and they depend on the mechanical action that they have to perform. The mechanical work varies widely and due to the interdependence between electrical and mechanical parameters, the Power Amplifier driving the piezoelectric load "sees" a continuously varying electrical load. Fast reaction to fast load change is therefore something desirable. Typical piezoelectric constructions in Medical applications can be exemplified in U.S. Pat. No. 4,530,138 or U.S. Pat. No. 3,889,166

1. Field of the Invention

The invention in general relates to Medical Instruments delivering ultrasonic energy to perform work and more particularly to improvements related to load monitoring, by implementing a method to digitally measure the distance from optimal load conditions and also a method to fast react (and shut down if necessary) due to load changes in one clock cycle of the Power Amplifier if the load changes in one cycle.

2. Description of Prior Art

For cutting and cauterization applications, In Surgical Instrument presented in U.S. Pat. No. 7,273,483 a solution is offered for an environment where transducer temperature increase can lead to material fatigue and possible failure. Mainly for adjusting Power to the load via a push-pull amplifier, it measures load conditions via current averaging and voltage averaging followed by analog to digital (ADC) conversion in a feedback loop control scheme. Reaction time to load change is thus determined by current and voltage averaging filters plus ADC conversion time, too slow for a sudden load change which could lead to Instrument failure. A similar feedback approach is adopted in U.S. Pat. Nos. 5,026,387 and 4,056,761. These Instruments cannot react fast enough to prevent a catastrophic load condition which could lead to shatter or breakage.

In Exogen 2000+SAFHS, a Pulsed Ultrasound Instrument for bone fracture healing manufactured by Smith and Nephew located in Memphis, Tenn., a generic averaging filter is used to determine transducer electrical impedance variation due to the amount of coupling gel used and thus determining gel/no gel alarm conditions (U.S. Pat. No. 6,261,249). These Pulsed Ultrasound Instruments under sudden load change can also lead to Instrument failure. Therefore there is a need for a fast Instrument response due to fast load change. In this application a Class E Power Amplifier driving a piezoelectric load is used as Power Stage. Class E amplifier is well known. Fast feedback Class E operation is also not new. A generic Class E amplifier as final power stage and a predictor to load change was presented in [1]. It was tested by slightly adjusting the frequency of operation. In reference [1] a resistor is placed in series with the source of power transistor Q1 and an additional circuit is built to indicate class E or non class E operation, however such a circuit has a time response of 20 to 30 ms when operating at 1 MHz which in certain situations like highly load sensitive ultrasonic surgery instruments and Pulsed Ultrasound can be too slow. FIG. 4A in U.S. Pat. No. 3,919,656 and reference [1] FIG. 2 present typical Class E waveforms under variable load quality factor (Q). Design of Class E power Amplifiers under nominal or off nominal (variable duty cycle D, or duty ratio as it is considered in [2], [3]) is also known.

SUMMARY OF THE INVENTION

The present invention presents a method to control the Ultrasonic power delivered to a piezoelectric or magnetostrictive load using a Class E Amplifier by means of digitally monitoring in each cycle the amplifier operation. This Power Amplifier is first designed so that it presents a predefined sensitivity to load changes and these changes are monitored in each clock cycle by means of a timer content. A trend can therefore be determined as successive values of a counter timer number. An emergency shut down is thus possible in one clock cycle of the first occurrence of non optimal operation of the Class E amplifier due to load change.

A non optimal operation is a non-zero MOSFET drain voltage at MOSFET turn on.

BRIEF DESCRIPTION OF THE DRAWINGS

FIG. 1 is a general illustration of an ultrasonic energy delivery method and apparatus for high efficiency, high safety in accordance with an exemplary embodiment FIG. 2 is an illustration of optimal Class E drain voltage landing and the start-stop timer mechanism.

FIG. 3 is an illustration of a suboptimal Class E drain voltage landing, due to a higher Q where the timer content is higher due to the fact that time difference t2-t1 is higher than in optimal case.

FIG. 4 represents a lower than nominal Q load variation and the MOSFET drain voltage landing. Moment t1 is very close to t2 and the timer content is zero.

FIG. 5 is an illustration of the software loop decision blocks to apply or not MOSFET gate pulse in the next cycle (period).

FIG. 6 shows a dynamic transition from optimal Class E operation to non Class E operation due to fast load change and the fast action of the feedback loop in the present method.

FIG. 7 graphically illustrates the efficiency indicator (i.e. timer content) for different modes of Class E operation.

DESCRIPTION OF THE PREFERRED EMBODIMENT

In reference to FIGS. 1 to 7 a description of the preferred embodiment is presented.

Ref to FIG. 1, a microcontroller MCU 100 is used to program the programmable oscillator 106 via an interface 105. Examples of such components could be Texas Instruments, Dallas Tex., MSP430FG437 for the MCU and Linear Technology, Milpitas Ca, LTC6904 for the frequency f programmable oscillator. The digital signal from 106 is gated with the processor logic signal 112 in gate 113 in order to generate bursts of pulses according to treatment indication or a continuous digital signal. For example the duration of the logic "1" signal 112 could be 200 µs followed by 800 µs "0"

logic for a 1 KHz PRF (Pulse Repetition Rate) ultrasound delivery system, or a continuous digital logic "1" for 25 KHz to 100 KHz Ultrasonic surgery Instruments. R9, C5 is an integrator circuit, the resultant triangular pulses are applied to the inverting input of comparator 115. The non-inverting input of this comparator takes a continuously variable voltage signal from a digital to analog converter, D/A on line 121 via resistors R7, R8, R11 and as a result the digital signal at the output of the gate 114 is adjustable both in duty cycle D, and frequency f. This is block 117 shown in an accolade, the waveform is shown pictorially in block 118. The driving signal is applied to MOSFET Q1 gate via the coupling capacitor C4 and resistor R5 in junction 126. This digital signal also drives, via connection 127 the clock input of the D flip-flop 102. Another comparator, 116 takes at the inverting input a fraction (k) of the MOSFET drain voltage via resistor divider R1 and R2 and at the non-inverting input the power Amplifier voltage Vdd, via resistors R3 and R4. Resistors R1 and R3 are connected to ground at line 132. This voltage, Vdd is generated by the DC/DC converter 101, preferably a high speed Class E converter. Such a converter is known for one skilled in the art and has the advantage of having both step-up and step-down capabilities [4], [6]. For fast DC/DC ON/OFF time, the switching frequency of the converter 101 should be at least 10 times higher than the frequency generated by the oscillator 106. For example, for f=1.5 MHz used in bone fracture healing Instruments the frequency generated by the processor 100 on line 108 should be at least 15 MHz to start the DC/DC converter 101. For 20 KHz to 100 kHz Ultrasonic surgery Instruments, at least a 1 MHz frequency Class E DC/DC is required. The Enable line 109 is a logic signal to turn ON/OFF the converter. R10 and C7 provide a low pass filter function for comparator 116 output and is connected, via line 128 to the D input of the D flip-flop 102. The input D of the flip-flop 102 is also connected via line 134 to an MCU 100 timer input. The inverted output 107 ($\bar{Q}$) is connected to an MCU (or processor) 100 input interrupt line INT1. The fast dynamic action on INT1 input can be explained with reference to FIG. 6 where, due to a fast load change, a transition from optimal Class E to non-optimal (non Class E) drain voltage operation is illustrated. As soon as, due to drain voltage change, the comparator output waveform 605 trailing edge falls behind the trailing edge of the Mosfet Q1 gate voltage 603, the interrupt line 607 normally at "0" logic is now fast switched to logic 1 thus providing an interrupt INT1 to the processor 100. It is recognized here that this constitutes a fast feedback mechanism for class E operation with one Mosfet clock cycle delay. The processor can now decide whether to stop providing further pulses and shut down operation due to abnormal load conditions or continue providing pulses and monitor more closely the load via Mosfet drain voltage.

Vcomp and V threshold in FIG. 6 represent the input voltages of comparator 116. Ref. now to FIG. 2, an optimal Class E drain voltage is shown. The horizontal dotted line represents ground reference voltage (GND) as in FIGS. 3 and 4. D represents the Mosfet turned OFF portion of a typical clock cycle. In normal load conditions (optimal or nominal operation as it is known in published literature, for example ref. [2], [3] the drain voltage during the Mosfet turn-on (t2) should be zero ("0") with "0" slope.

The comparator 116 $V_{threshold}$ voltage is such that the drain voltage falls below this level at moment t1 and at this moment the comparator output switches to logic 1, starting the timer counter. When the Mosfet turns on at moment t2 the software stops the counter and the count number N indicates a typical class E optimal drain voltage landing. The falling edge of the Mosfet clock at moment t3 happens before the comparator output falling edge at moment t4 due to low pass filtering action of R10 and C7. So in normal (optimal) operation, in each MOSFET clock cycle a timer is started by comparator 116 output connection 134 and is stopped by software via connection 135, which is another interrupt line (INT2) to the processor. INT1 has higher priority than INT2 since it indicates a non Class E operation. The timer content, N gives thus an indication of Class E Power Amplifier distance from optimal operation. In this load condition the D flip-flop output stays always "0" logic since the clock for D flip-flop 102 always "sees" a "1" (and latches it) at the D input and therefore the negated output is "0". The counter start signal always occurs before the Mosfet clock arrives, therefore no Interrupt INT1 is triggered. At the moment t2 the count is N1±ΔN as illustrated in FIG. 7.

A sub optimal class E drain voltage landing is shown in FIG. 3 where the drain voltage falls to zero with non-zero slope. The drain voltage is limited to almost zero (actually slightly negative due to the Mosfet body diode). The distance between moments t1 and t2 is higher and the content N2 of the counter is higher than previously and thus the timer content (see N2 in FIG. 7 also) provides a digital indication of the distance from optimal Class E operating condition. Moments t3 and t4 occur as in FIG. 2 and D flip-flop output remains "0" and no interrupt is triggered. Optimal (FIG. 1) and suboptimal (fig2) conditions in Class E Amplifier operation are considered high efficiency because the voltage across MOSFET is zero at turn on (moment t2).

In FIG. 4 a non-ZVS (non Zero Voltage Switching) drain voltage landing is shown, where moment t2 occurs before t1. In this case comparator output remains "0" when the Mosfet clock trailing edge is applied and thus it latches logic "1" on Interrupt INT1, line 107. So comparator 102 output is now "0" and D flip-flop output is "1". Fast load conditions will lead to fast drain voltage change and as explained above, this is illustrated in FIG. 6 Here it is seen that as soon as the leading edge of comparator 116 signal output 605 falls behind Mosfet clock cycle at moment 608, an interrupt is triggered by the leading edge of the MOSFET gate pulse 608 due to a gradual transition from optimal to non optimal conditions and this change on D flip-flop output 606 is as fast as the load change. This is where "one clock cycle" shutdown is obvious. As soon as this condition occurs, the processor can stop providing pulses in the next cycle, so the abnormal load condition time resolution is one clock cycle and the condition can be addresses in the next clock cycle.

FIG. 5 represents a software flowchart diagram explaining the decision to further apply or not pulses based upon the Timer value N. N=N1±ΔN indicates an optimal operating condition (FIG. 7). If the value has a tendency to increase from cycle to cycle this is an indication of transition from optimal to suboptimal Class E operation (N2) and pulses are applied normally. If the trend from cycle to cycle is towards N decreasing, this is an indication that a non Class E operation is imminent and if the timer content falls below a predetermined safety value then the processor stops applying pulses by bringing line 112 to gate 114 to "0" logic.

In what follows, the analytical value of the Mosfet Q1 drain voltage is calculated along with $V_{threshold}$ and $V_{comparator}$.

This value depends on the duty cycle D, frequency f, power stage supply voltage Vdd and load phase angle φ.

The analysis is carried out with the usual assumptions for Class E operation [1]-[5] and considering load 131 in FIG. 1 connected at point 110 as pure resistive, with value R.

From FIG. 1 with angular switching frequency w=2πf and θ=ωt and considering the R1+R2 resistor value large enough so the current through it can be ignored, the inductor L1 current Idd is:

$$Idd = I_c + I_0 \quad (1)$$

where $I_c$ is the current through the capacitor C1 and $I_0$ is the load current.

$$I_c = i_c(\theta), I_0 = I_m \sin(\theta + \varphi) \quad (2)$$

$$i_c(\theta) = Idd - I_m \sin(\theta + \varphi) \quad (3)$$

The Mosfet drain voltage is the voltage across Capacitor C1, which is $$V_s(\theta) = \frac{1}{\omega C1} \int_0^\theta i_c d(\theta') \quad (4)$$

$$V_s(\theta) = \frac{Idd\,\theta + I_m \cos(\theta + \varphi) - I_m \cos \varphi}{\omega C1} \quad (5)$$

With zero voltage condition at Mosfet turn on $$Vs(2\pi D) = 0 \quad (6)$$

equation (5) becomes $$Idd = \frac{I_m}{2\pi D}[(1-\cos 2\pi D)\cos\varphi + \sin 2\pi D \sin\varphi] = \frac{I_m}{\pi D}\sin \pi D \sin(\pi D + \varphi) \quad (7)$$

Considering ideal components, the load output power is equal to the input power, i.e.

$$Idd\,Vdd = I_m^2 R/2 \quad (8)$$

so substituting Idd from (8) in (7), the load current amplitude is $$I_m = \frac{2Vdd \sin \pi D \sin(\pi D + \varphi)}{\pi DR} \quad (9)$$

and from (7) and (9) the power supply current is $$Idd = \frac{2Vdd \sin^2 \pi D \sin^2(\pi D + \varphi)}{\pi^2 D^2 R} \quad (10)$$

The dc component across choke inductor L1 is zero so, $$Vdd = \frac{1}{2\pi}\int_0^{2\pi D} Vs(\theta)\,d(\theta) \quad (11)$$

With $I_m$ and Idd in (5) from (9) and (10) respectively, equation (11) becomes after simple algebraic manipulations, $$\omega C1 \pi^2 RD = \sin \pi D \sin 2(\pi D + \varphi)(\sin \pi D - \pi D \cos \pi D) \quad (12)$$

And finally with Idd and $I_m$ from (10) and (9) respectively and with ωC1 from (12), equation (5), the time (θ) dependent Mosfet drain voltage becomes:

$$Vs(\theta, \varphi, Vdd, D) = \frac{Vdd}{D}\frac{\theta \sin(\pi D + \varphi) + \pi D[\cos(\theta + \varphi) - \cos\varphi]}{\cos(\pi D + \varphi)[\sin \pi D - \pi D \cos \pi D]} \quad (13)$$

Now, with $$k = \frac{R1}{R1 + R2}$$

the comparator voltage $V_{comp}$ in FIG. 1 is:

$$V_{comp} = \quad (14)$$
$$kV_{drain} = \frac{R1}{R1 + R2}\frac{Vdd}{D}\frac{\theta \sin(\pi D + \varphi) + \pi D[\cos(\theta + \varphi) - \cos\varphi]}{\cos(\pi D + \varphi)[\sin \pi D - \pi D \cos \pi D]}$$

$$V_{threshold} = \frac{R3}{R3 + R4}Vdd \quad (15)$$

It is contemplated here that R3 can be made variable (digital potentiometer) and thus an adaptive control can be implemented.

In reference to FIG. 1 again—the primary power supply 133 can be a lithium-ion battery pack or another power source. ON/OFF switch 124 is used to turn the instrument on and off. The linear regulator (LDO) 136 provides the necessary low voltage power Vcc at line 125 for the logic circuits and the MCU. Preferably LDO output voltage Vcc is between 3 and 3.6 V. After the instrument is turned on via switch 124 the DC/DC converter 101 is connected to the primary input Power supply 133 via line 123. Line 122 represents the output voltage of the DC/DC converter, Vdd. C8 is the output filter capacitor of the converter. The instrument is also provided with a display 119 and an alarm module 120. The latter can be a buzzer or a regular speaker. For one skilled in the art it is recognized that the power stage consisting of Mosfet transistor Q1, RF choke L1, capacitor C1, C2, and inductor L2 represents a Class E amplifier with a complex load (detailed as blocks 131 or 130) coupled directly or via transformer T1 in node 129. The load can be piezoelectric, resistive or magnetostrictive. For high power applications a stack consisting of piezoelectric rings can be used. Some manufactures of such rings are: Channel Industries (C8800 series for example), Morgan Matroc or APC. For magnetostrictive loads (terfenol) a typical manufacturer is ETREMA Inc. In this case the load will be mainly inductive and ref [4], [5] provide a way to carry out an inductive impedance inverter for Class E operation. The power stage preferably operates at a frequency near the series resonance of the piezoelectric element (marked fs in the waveform 104 block) where it can be reduced (simplified) to a parallel RC circuit. The closer to resonance frequency fs of the piezoelectric load, the more "pure resistive" the load. The drain voltage in FIG. 1 represented in block 111 and calculated in formula (13) above can have a shape represented in FIG. 2, 3, 4 or 5 depending on the load operating conditions. The operation of a class E amplifier under Class E circuit parameters variation is well known and has been described by Raab[7] and Kazimierczuk[2], [3], however the value of the drain voltage depending on the load phase angle, frequency, power supply voltage Vdd and duty cycle has not been directly calculated. A class E predictor [1] and drain voltage slope [2] have been used as ways to determine the distance from Class E operation. A new, fast feedback method has been implemented in the present description where the reaction time of the feedback loop due to load electrical impedance change is one Power Amplifier clock cycle. Also, a distance from Class E nominal operation is implemented in the form of digital timer content. It is contemplated that for one skilled in the art the present description can be extended to other industrial application some of which are (but not limited to) induction heating and cleaning it is contemplated that although block 102 was described as a "D flip-flop" external to the processor 100, this could be integrated within the processor or an equivalent circuit could be used (for example an RST flip-flop) without departing from the scope of the present description. Similarly, alternatives to the Mosfet switch Q1 are within the scope of the current description. Also, although the preferred embodiment presents an "analog" Duty cycle adjustment block 117 using a comparator and an integrator, a "digital" duty cycle adjustment (a Pulse Width Modulator PWM, or a digitally generated variable width pulse) is within the scope of the present description. Similarly, it is contemplated that the Class E DC/DC converter in the preferred embodiment in FIG. 1 can be replaced with other known DC/DC converter topologies, for example, SEPIC, çuk without departing from the scope of the current description. Linear regulator 136 can also be a step-down (buck) DC/DC converter.

What is claimed is:

1. An apparatus for delivering ultrasonic power, comprising: a processor connected to a programmable frequency oscillator providing a variable frequency f; a duty cycle adjustment block for adjusting the duty cycle of a MOSFET; a variable voltage output DC/DC converter; and at least one class E power amplifier driving the piezoelectric or magnetostrictive load with a one-clock-cycle shut down feedback mechanism using a comparator and a digital efficiency indicator, wherein the piezoelectric or magnetostrictive load generates the ultrasonic power.

2. A feedback loop according to claim 1 to monitor the drain voltage of the at least one class E power amplifier, said class E power amplifier further comprising: a voltage divider connected to the drain of the MOSFET and to an input of said comparator; a second voltage divider connected to said class E power amplifier and to the other input of said comparator; an integrator circuit connected to the output of said comparator; and a D type flip-flop having a clock input, a D input, and a negated output, wherein the clock input is connected to the gate terminal of said MOSFET, the D input is connected to the output of said integrator, and the negated output is connected to a first interrupt of said processor.

3. A digital class E efficiency indicator according to claim 2, further comprising: a timer counting pulses which is started by the input of said D type flip-flop and is stopped by a second interrupt to said processor provided by the gate terminal of said MOSFET; and a one-clock-cycle emergency shutdown provided by the negated output of said D-type flip-flop connected to a second interrupt line of said processor.

4. A digital trend assessment indicator according to claim 3, comprising: estimating in each clock cycle of said MOSFET the trend based upon the current and previous timer values and making a decision to continue or to stop providing pulses to the gate terminal of said MOSFET gate; and an application specific safety threshold limit.

* * * * *